United States Patent
Schubert

(10) Patent No.: US 11,804,586 B2
(45) Date of Patent: *Oct. 31, 2023

(54) HIGH-VOLTAGE SOLID-STATE TRANSDUCERS AND ASSOCIATED SYSTEMS AND METHODS

(71) Applicant: Micron Technology, Inc., Boise, ID (US)

(72) Inventor: Martin F. Schubert, Mountain View, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/844,606

(22) Filed: Jun. 20, 2022

(65) Prior Publication Data

US 2022/0320402 A1 Oct. 6, 2022

Related U.S. Application Data

(60) Continuation of application No. 16/945,454, filed on Jul. 31, 2020, now Pat. No. 11,367,822, which is a
(Continued)

(51) Int. Cl.
*H01L 33/62* (2010.01)
*H01L 33/32* (2010.01)
(Continued)

(52) U.S. Cl.
CPC .......... *H01L 33/62* (2013.01); *H01L 27/153* (2013.01); *H01L 31/02005* (2013.01);
(Continued)

(58) Field of Classification Search
None
See application file for complete search history.

(56) References Cited

U.S. PATENT DOCUMENTS 6,054,716 A 4/2000 Sonobe et al.
6,281,524 B1 8/2001 Yamamoto et al.
(Continued)

FOREIGN PATENT DOCUMENTS

DE 102008011848 A1 9/2009
DE 102008022942 A1 11/2009
(Continued)

OTHER PUBLICATIONS

CN Patent Application No. 201280046381.6—Chinese Office Action and Search Report, dated Dec. 24, 2015, with English Translation, 37 pages.
(Continued)

*Primary Examiner* — Benjamin P Sandvik
(74) *Attorney, Agent, or Firm* — Perkins Coie LLP

(57) ABSTRACT

High-voltage solid-state transducer (SST) devices and associated systems and methods are disclosed herein. An SST device in accordance with a particular embodiment of the present technology includes a carrier substrate, a first terminal, a second terminal and a plurality of SST dies connected in series between the first and second terminals. The individual SST dies can include a transducer structure having a p-n junction, a first contact and a second contact. The transducer structure forms a boundary between a first region and a second region with the carrier substrate being in the first region. The first and second terminals can be configured to receive an output voltage and each SST die can have a forward junction voltage less than the output voltage.

20 Claims, 9 Drawing Sheets

Related U.S. Application Data continuation of application No. 16/455,522, filed on Jun. 27, 2019, now Pat. No. 10,777,721, which is a continuation of application No. 15/623,664, filed on Jun. 15, 2017, now Pat. No. 10,381,535, which is a division of application No. 15/082,764, filed on Mar. 28, 2016, now Pat. No. 9,711,701, which is a continuation of application No. 13/210,249, filed on Aug. 15, 2011, now Pat. No. 9,299,742.

(51) Int. Cl.
| | |
|---|---|
| H01L 33/38 | (2010.01) |
| H01L 27/15 | (2006.01) |
| H01L 31/02 | (2006.01) |
| H01L 31/0304 | (2006.01) |
| H01L 33/00 | (2010.01) |

(52) U.S. Cl.
CPC .. *H01L 31/03044* (2013.01); *H01L 31/03048* (2013.01); *H01L 33/0012* (2013.01); *H01L 33/32* (2013.01); *H01L 33/382* (2013.01); *H01L 2924/0002* (2013.01)

(56) References Cited

U.S. PATENT DOCUMENTS

| | | | |
|---|---|---|---|
| 6,998,642 | B2 | 2/2006 | Lin et al. |
| 7,535,028 | B2 | 5/2009 | Fan et al. |
| 7,884,377 | B2 | 2/2011 | Onushkin et al. |
| 9,299,742 | B2 | 3/2016 | Schubert |
| 9,548,433 | B2 | 1/2017 | Illek et al. |
| 9,711,701 | B2 | 7/2017 | Schubert |
| 10,381,535 | B2 | 8/2019 | Schubert |
| 10,777,721 | B2 | 9/2020 | Schubert |
| 2005/0056855 | A1 | 3/2005 | Lin et al. |
| 2008/0150440 | A1 | 6/2008 | Hsu |
| 2009/0008654 | A1 | 1/2009 | Nagai |
| 2009/0101923 | A1 | 4/2009 | Choi et al. |
| 2009/0262527 | A1 | 10/2009 | Chou |
| 2010/0187559 | A1 | 7/2010 | Han |
| 2010/0252840 | A1 | 10/2010 | Ibbetson et al. |
| 2011/0004953 | A1 | 3/2011 | Lee et al. |
| 2011/0049537 | A1 | 3/2011 | Lee et al. |
| 2011/0084294 | A1 | 4/2011 | Yao |
| 2011/0101390 | A1 | 5/2011 | Engl et al. |
| 2011/0140135 | A1* | 6/2011 | Lee ............ H01L 33/60 257/88 |
| 2011/0156064 | A1 | 6/2011 | Seo et al. |
| 2011/0193123 | A1 | 8/2011 | Moon et al. |
| 2011/0210362 | A1 | 9/2011 | Lee et al. |
| 2011/0215358 | A1 | 9/2011 | Hwang et al. |
| 2011/0272728 | A1 | 11/2011 | Rode et al. |
| 2012/0086026 | A1 | 4/2012 | Engl et al. |
| 2013/0043481 | A1 | 2/2013 | Shubert |
| 2015/0144870 | A1 | 5/2015 | An |
| 2016/0211430 | A1 | 7/2016 | Schubert |
| 2017/0288110 | A1 | 10/2017 | Schubert |
| 2019/0326494 | A1 | 10/2019 | Schubert |
| 2020/0365785 | A1 | 11/2020 | Schubert |

FOREIGN PATENT DOCUMENTS

| | | |
|---|---|---|
| JP | 2000312027 A | 11/2000 |
| JP | 2011054967 A | 3/2011 |
| JP | 2011513957 A | 4/2011 |
| JP | 2011139038 A | 7/2011 |
| KR | 101039610 B1 | 6/2011 |
| TW | 201036213 A | 10/2010 |
| WO | 20100093190 | 8/2010 |
| WO | 2010114250 A2 | 10/2010 |
| WO | 20100126601 | 11/2010 |

OTHER PUBLICATIONS

EP Patent Application No. 16197569.3—Extended European Search Report, dated Mar. 21, 2017, 7 pages.

KR Patent Application No. 10-2014-7006271—Korean Office Action and Search Report, dated Apr. 15, 2015, with English Translation, 15 pages.

Office Action dated Apr. 21, 2015 in Japan Application No. 2014-526046, 4 pages.

"Extended European Search Report dated Feb. 26, 2015 in European Application No. 12823667.6, 7 pages."

"International Search Report and Written Opinion dated Jan. 30, 2013 in International Application No. PCT/US2012/048808, 8 pages."

"Office Action dated May 15, 2014 in Taiwan Application No. 101128809, 26 pages."

"Office Action dated Dec. 24, 2015 in Taiwan Application No. 101128809, 5 pages."

\* cited by examiner

HIGH-VOLTAGE SOLID-STATE TRANSDUCERS AND ASSOCIATED SYSTEMS AND METHODS

CROSS-REFERENCE TO RELATED APPLICATION(S)

This application is a continuation of U.S. patent application Ser. No. 16/945,454, filed Jul. 31, 2020; which is a continuation of U.S. patent application Ser. No. 16/455,522, filed Jun. 27, 2019, now U.S. Pat. No. 10,777,721; which is a continuation of U.S. patent application Ser. No. 15/623,664, filed Jun. 15, 2017, now U.S. Pat. No. 10,381,535; which is a divisional of U.S. patent application Ser. No. 15/082,764, filed Mar. 28, 2016, now U.S. Pat. No. 9,711,701; which is a continuation of U.S. patent application Ser. No. 13/210,249, filed Aug. 15, 2011, now U.S. Pat. No. 9,299,742; each of which is incorporated herein by reference in its entirety.

TECHNICAL FIELD

The present technology is related to solid-state transducers ("SSTs"). In particular, the present technology relates to high-voltage SSTs and associated systems and methods.

BACKGROUND

Mobile phones, personal digital assistants ("PDAs"), digital cameras, MP3 players, and other electronic devices utilize light-emitting diodes ("LEDs"), organic light-emitting diodes ("OLEDs"), polymer light-emitting diodes ("PLEDs"), and other SST devices for backlighting. SST devices are also used for signage, indoor lighting, outdoor lighting, and other types of general illumination. FIG. 1A is a cross-sectional view of a conventional LED device 10a with lateral contacts. As shown in FIG. 1A, the LED device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The LED device 10a also includes a first contact 17 on the front surface of the P-type GaN 16 and a second contact 19 spaced laterally apart from the first contact 17 on the front surface of the N-type GaN 15. The first contact 17 typically includes a transparent and conductive material (e.g., indium tin oxide ("ITO")) to allow light to escape from the LED structure 11.

FIG. 1B is a cross-sectional view of another conventional LED device 10b in which the first and second contacts 17 and 19 are opposite each other, e.g., in a vertical rather than lateral configuration. During formation of the LED device 10b, the N-type GaN 15, the active region 14 and the P-type GaN 16 are stacked sequentially on a growth substrate (not shown), similar to the substrate 20 shown in FIG. 1A. The first contact 17 is formed on the P-type GaN 16, and a carrier substrate 21 is attached to the first contact 17. The growth substrate is then removed and the second contact 19 is formed on the N-type GaN 15. The structure is then inverted to produce the orientation shown in FIG. 1B. The N-type GaN 15 at the front surface of the LED device 10b provides better current spreading than the P-type GaN 16. The vertical LED device 10b also has enhanced light extraction and thermal properties, and accordingly a higher efficiency than the lateral LED device 10a of FIG. 1A.

Typical LEDs have relatively low forward junction voltages (or built-in voltages) compared to the power supplies with which they are used. For example, gallium nitride/indium gallium nitride (GaN/InGaN) based LED dies typically operate at a forward junction voltage of approximately 3 volts direct current ("DC") and aluminum indium gallium phosphide (AlInGaP) based LED dies typically have a forward junction voltage of approximately 2 volts DC, whereas many power supplies operate at 48 volts alternating current ("AC"), 120 volts AC, 60 volts DC, etc. Therefore, power supplies typically include AC/DC rectifiers, DC/DC converters, power conditioners, drivers, and/or other suitable components to supply power to LED dies at suitable voltage levels. However, power supplies and associated components operate more efficiently when the difference between the output voltage and the input voltage is smaller. Accordingly, high-voltage LEDs (e.g., 24 volts, 60 volts, etc.) are preferred for use with high-voltage power supplies to enhance the overall efficiency of the LED system.

Conventional high-voltage LEDs are made by coupling several lateral LED dies (e.g., the lateral LED device 10a of FIG. 1A) together in series. For example, twenty lateral LED dies, each having a forward junction voltage of 3 volts, can be serially coupled to operate at a combined forward junction voltage of 60 volts. Lateral LEDs, however, have several performance limitations. For example, referring to FIG. 1A, the P-type GaN 16 at the front surface of the lateral LED device 10a does not inherently provide current spreading, and therefore current and light concentrate under the first contact 17. To increase current spreading across the lateral LED device 10a, the first contact 17 must be thickened and extend over a larger portion of the P-type GaN 16, which makes the first contact 17 less transparent and decreases the light extraction from the LED device 10a. Additionally, lateral LEDs typically have poor thermal characteristics and low overall efficiency. Accordingly, there is a need for high-voltage LEDs and other high-voltage SSTs with enhanced efficiency and performance.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views and/or embodiments.

DETAILED DESCRIPTION

Specific details of several embodiments of high-voltage SSTs and associated systems and methods are described below. The term "SST" generally refers to solid-state transducer devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state devices that convert electromagnetic radiation into electricity. Additionally, as used herein, the phrases "high voltage" and "low voltage" refer to relative voltage levels. Therefore, the same voltage level (e.g., 12 volts) may be considered "high voltage" when it is compared to 6 volts, but may be considered a "low voltage" when it is compared is 24 volts. A person skilled in the relevant art will also understand that the technology may have additional embodiments, and that the technology may be practiced without several of the details of the embodiments described below with reference to FIGS. 2A-8.

Figure 1A:
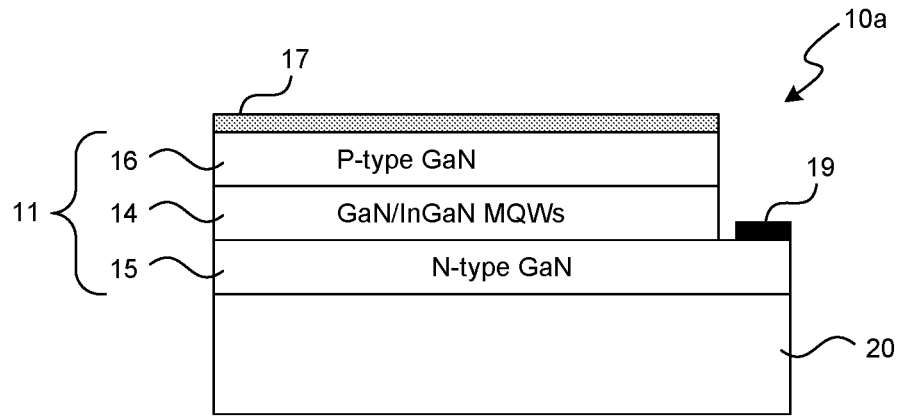
FIG. 1A is a partially schematic, cross-sectional diagram of an LED device configured in accordance with the prior art.
Figure 1B:
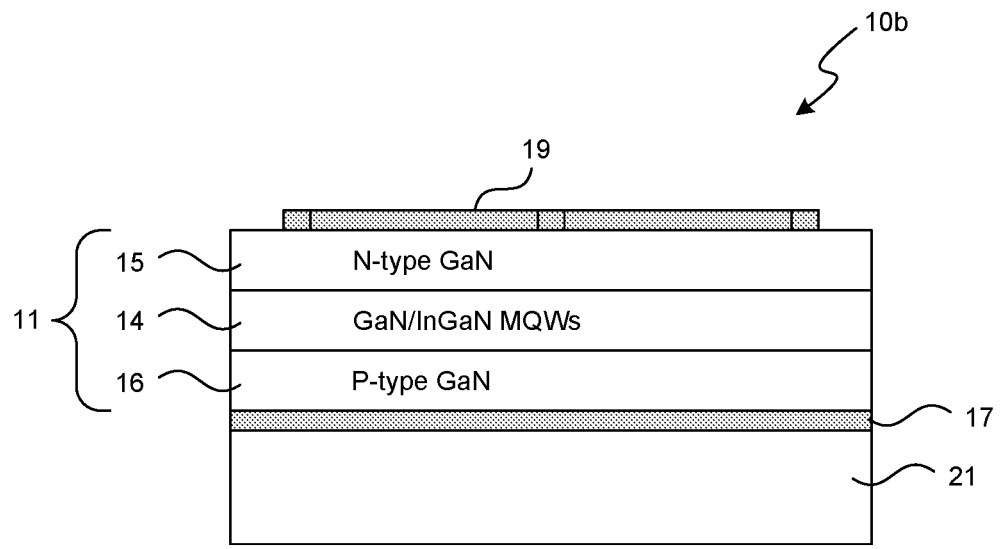
FIG. 1B is a partially schematic, cross-sectional diagram of another LED device configured in accordance with the prior art.
Figure 2A:
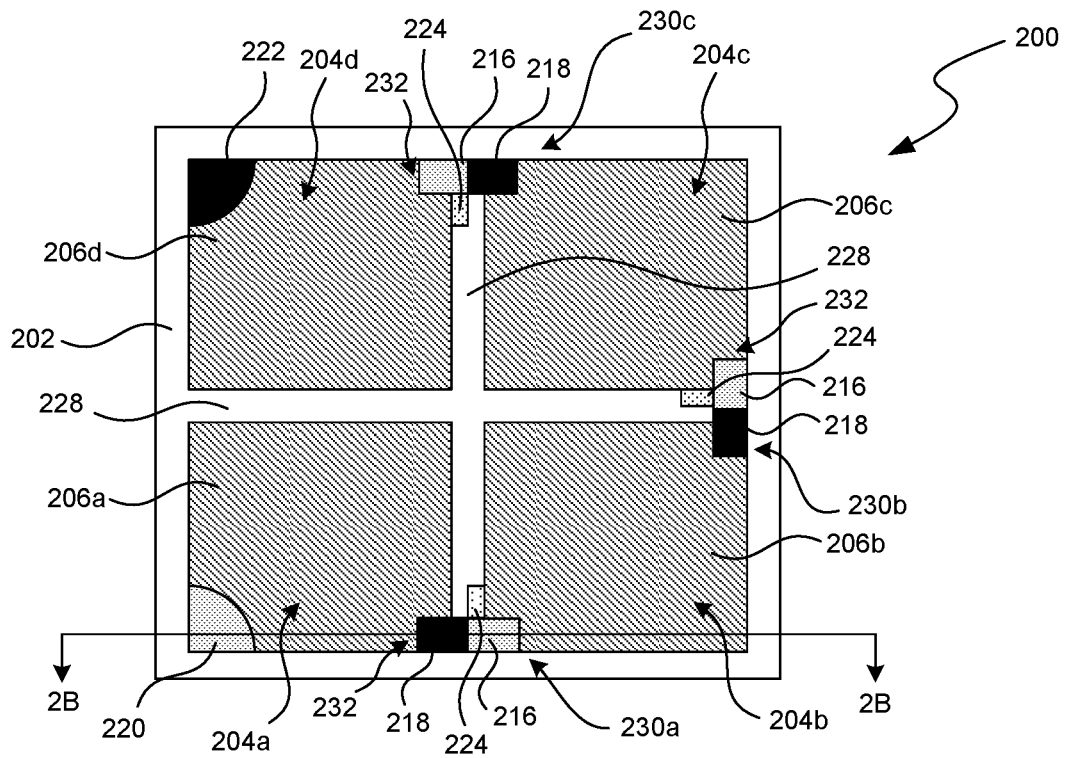
FIGS. 2A and 2B are partially schematic top plan and cross-sectional views, respectively, of a multi-junction SST device with buried contacts configured in accordance with an embodiment of the present technology.
Figure 2B:
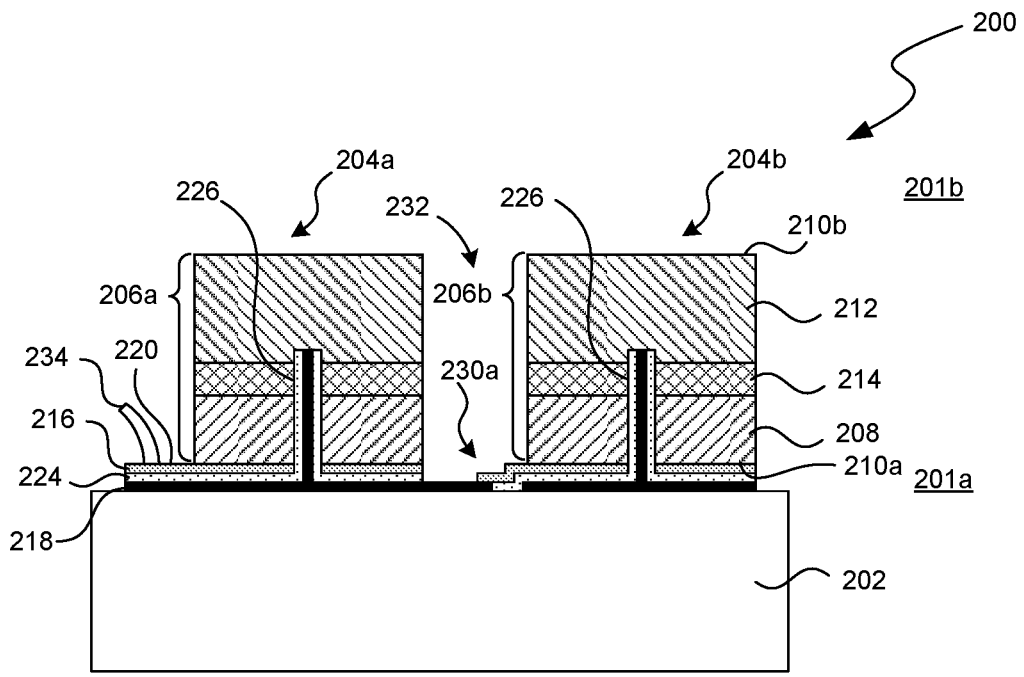

FIG. 2A is a partially schematic top plan view of a multi-junction SST device 200 ("SST device 200") configured in accordance with an embodiment of the present technology, and FIG. 2B is a partially schematic cross-sectional view of the SST device 200 taken substantially along line 2B-2B of FIG. 2A. Referring first to FIG. 2A, the SST device 200 can include a carrier substrate 202 and a plurality of SST dies (identified individually as first through fourth SST dies 204a-d, respectively, and referred to collectively as SST dies 204) electrically coupled together in series between a first terminal 220 and a second terminal 222. Each SST die 204 can include a separate transducer structure (identified individually as first through fourth transducer structures 206a-d, respectively, and referred to collectively as transducer structures 206), a first contact 216 on the backside of the transducer structure 206, and a second contact 218. In various embodiments, the SST device 200 can also include a lens, a mirror, and/or other suitable optical and/or electrical components. In the illustrated embodiment, the SST device 200 includes four SST dies 204a-d. A person of skill in the art, however, will understand that the SST device 200 can include two, three, or more than four SST dies 204.

The terms "backside" and "front side" are used herein to refer to relative positions of elements with respect to the emissions from or to the SST device 200. The front side of an element refers to a side or surface facing in the same direction as the emissions, and the backside refers to the side or surface of the element facing away from the direction of the emissions. For example, if the SST device 200 is configured to emit light, the side of the carrier substrate 202 that faces the same direction as light emanating from the SST device 200 is the front side and the opposite side of the carrier substrate 202 is the backside.

As shown in FIG. 2A, the SST dies 204 can be arranged in an array on the carrier substrate 202 with channels 228 separating adjacent SST dies 204. The channels 228 can connect with or include openings 232 above the first and second contacts 216 and 218 to allow the SST dies 204 to be serially coupled together at interconnect regions (identified individually as first-third interconnect regions 230a-230c, respectively, and referred to collectively as interconnect regions 230) proximate to the backside of the transducer structures 206. The openings 232 can also expose portions of the first and second contacts 216 and 218 at the backside of the transducer structures 206. In the illustrated embodiment, a portion of the first contact 216 of the first SST die 204a is connected to the first terminal 220 and a portion of the second contact 218 of the fourth SST die 204d is connected to the second terminal 222. In other embodiments, exposed portions of the first and second contacts 216 and 218 of other SST dies 204 in the array can also be connected to the first and second terminals 220 and 222.

Referring now to FIG. 2B, each transducer structure 206 can include an active region 214 between a first semiconductor material 208 at a first side 210a of the transducer structure 206 and a second semiconductor material 212 at a second side 210b of the transducer structure 206 opposite the first side 210a. The first and second semiconductor materials 208 and 212 can be doped with impurities to form a p-n junction. For example, the first semiconductor material 208 can be a P-type semiconductor material (e.g., P-type GaN), and the second semiconductor material 212 can be an N-type semiconductor material (e.g., N-type GaN). This configuration is suitable when the transducer structure 206 is formed on a growth substrate (not shown), inverted, and subsequently attached to the carrier substrate 202. In other embodiments, the first and second semiconductor materials 208 and 212 may be reversed.

The active region 214 can include a single quantum well ("SQW"), multiple quantum wells ("MQWs"), and/or a bulk semiconductor material. The term "bulk semiconductor material" generally refers to a single grain semiconductor material (e.g., InGaN) with a thickness greater than approximately 10 nanometers and up to approximately 500 nanometers. In other embodiments, the transducer structure 206 can include other suitable semiconductor materials, such as gallium arsenide (GaAs), aluminum gallium arsenide (AlGaAs), gallium arsenide phosphide (GaAsP), etc.), and/or other semiconductor materials.

As shown in FIG. 2B, the first contact 216 can be positioned in a first region 201a and can be electrically coupled to the first semiconductor material 208. As used herein, elements positioned in the first region 201a are positioned in a region bounded internally by the first side 210a of the transducer structure 206, and elements positioned in a second region 201b are positioned in a region bounded internally by the second side 210b of the transducer structure 206. In various embodiments, the first contact 216 can be made from a reflective material, such as nickel (Ni), silver (Ag), copper (Cu), aluminum (Al), tungsten (W), and/or other suitable reflective materials. The reflective first contact 216 can redirect emissions (e.g., light, energy, etc.) back through the transducer structure 206 toward the second side 210b to enhance emissions from the SST die 204. In other embodiments, the first contact 216 can be made from non-reflective materials and/or the SST 204 can include separate reflective elements positioned in the first region 201*a*.

The second contact 218 can be a buried contact that is electrically coupled to the second semiconductor material 212. In the embodiment illustrated in FIG. 2B, for example, the second contact 218 extends along the backside of the first contact 216 and projects through the first contact 216 at least to the second semiconductor material 212. In other embodiments, the first contact 216 is spaced laterally apart from the second contact 218 such that the buried second contact 218 projects through a plane containing the first contact 216. For illustrative purposes, each SST die 204 includes one buried second contact 218, but in other embodiments each SST die 204 can include a plurality of buried contact elements extending into the transducer structure 206. The second contact 218 can be made from titanium (Ti), aluminum (Al), nickel (Ni), silver (Ag), and/or other suitable conductive materials.

As further shown in FIG. 2B, a dielectric material 224 can be positioned between the first and second contacts 216 and 218 to electrically isolate the two from one another. The dielectric material 224 can also extend along a sidewall 226 of the buried second contact 218 to electrically isolate the second contact 218 from the first semiconductor material 208 and the active region 214. The dielectric material 224 can be made from silicon dioxide ($SiO_2$), silicon nitride (SiN), and/or other suitable generally nonconductive materials.

In a particular embodiment, the carrier substrate 202 is made from a nonconductive, semiconductive or low conductivity material, such as a ceramic material, silicon, polysilicon, and/or other suitable substrate materials. Accordingly, as shown in FIG. 2B, the carrier substrate 202 can be attached to the backside of the SST dies 204 without shorting the dies via the second contacts 218. As explained in further detail below with reference to FIGS. 3A and 3B, in other embodiments the carrier substrate 202 can be made from a conductive material that serves as a thermal pad to draw heat away from the SST dies 204 and thereby improves the thermal performance of the SST device 200.

As further shown in FIG. 2B, the opening 232 between the adjacent first and second transducer structures 206*a* and 206*b* exposes a portion of the second contact 218 as it extends beyond the backside of the first transducer structure 206*a*, and exposes a portion of the first contact 216 as it extends beyond the backside of the second transducer structure 206*b*. This allows the first and second contacts 216 and 218 of the adjacent first and second SST dies 204*a* and 204*b* to be serially coupled together in the first region 201*a* at the first interconnect region 230*a*. The second and third interconnect regions 230*b* and 230*c* can be formed similarly such that the first-fourth SST dies 204*a*-204*d* are coupled together in series. Additionally, the openings 232 allow the first and second terminals 220 and 222 to be positioned in the first region 201*a* and to be electrically accessible from the front side of the SST device 200 via wirebonds 234, solder balls, and/or other suitable electrical connections.

The SST device 200 has a total forward junction voltage that is approximately equivalent to the sum of the forward junction voltages of the individual transducer structures 206. For example, if each transducer structure 206 has a forward junction voltage of approximately 4 volts, the four-die SST device 200 of FIGS. 2A and 2B has a combined forward junction voltage of 16 volts. The SST device 200 can then be coupled to a power supply (not shown) with an output voltage approximately the same as (e.g., 20 volts) the combined forward junction voltage of the SST device 200. Since power supplies and associated components (e.g., drivers) operate more efficiently when the difference between the input voltage and the output voltage is smaller, the increased forward junction voltage of the SST device 200, which correlates to the output voltage of the power supply and/or associated component, can enhance the efficiency of a higher voltage power supply. Additionally, the SST device 200 can be coupled to higher voltage power supplies and operate more efficiently than any one of the SST dies 204 alone. In selected embodiments, the SST device 200 can be configured to have a sufficiently high forward junction voltage such that the SST device 200 can be driven directly by a standard AC power supply (e.g., a 120 volt power supply; not shown), and eliminate the need for a driver. Moreover, the high-voltage SST device 200 can also enhance the conversion efficiency when an AC power supply must be converted to DC.

During operation, a voltage can be applied to the first and second terminals 220 and 222. As discussed above, the high-voltage SST device 200 can decrease the difference between the input voltage and the output voltage of the associated power supply, and can therefore improve the efficiency of the overall system. As shown in FIG. 2B, the first and second contacts 216 and 218 and the first and second terminals 220 and 222 can be positioned in the first region 201*a* such that neither blocks emissions from or to the second side 210*b* of the transducer structure 206. The reflective characteristics of the first contact 216 can further enhance emissions through the second side 210*b* of the transducer structure 206. Additionally, the configuration of the SST dies 204 allow N-type GaN to be used as the second semiconductor material 212 positioned at the second side 210*b* of the transducer structure 206. N-type GaN, unlike P-type GaN, inherently spreads current across the transducer structure 206, and therefore provides improved current spreading and uniformity across the SST device 200. N-type GaN also facilitates surface roughening, and can therefore be used as the second semiconductor material 212 to increase extraction efficiency of the SST device 200. Accordingly, the SST device 200 can have increased emission extraction, enhanced current uniformity, and/or higher overall efficiency than conventional high-voltage SST devices with lateral SST dies.

Figure 3A:
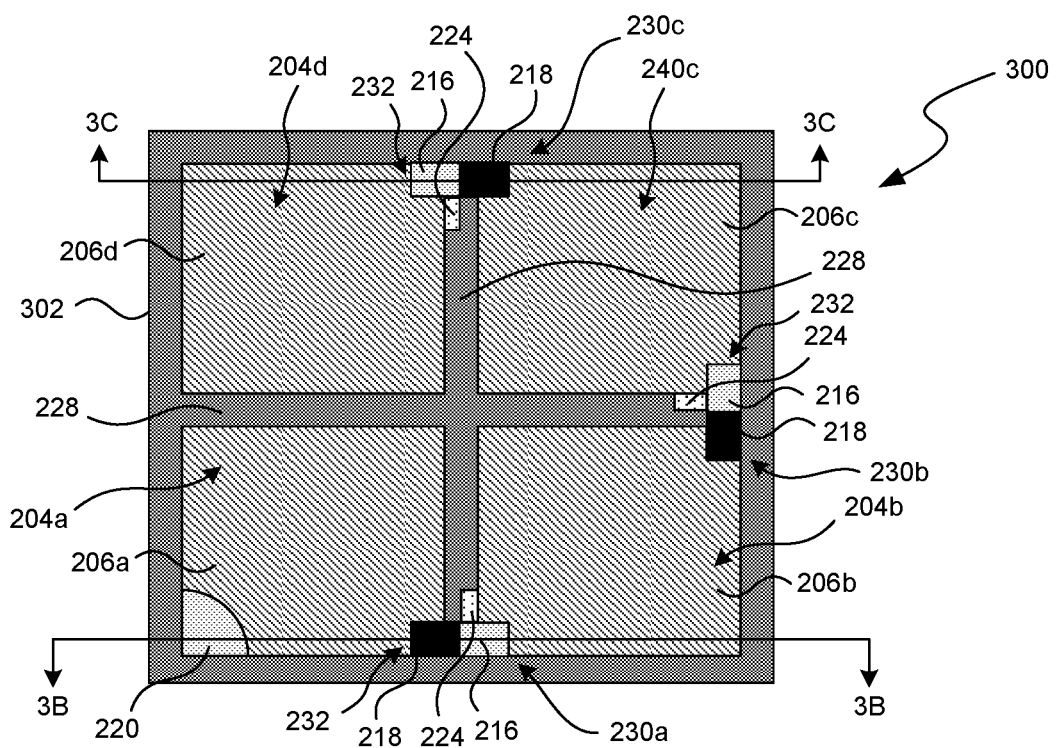
FIGS. 3A-3C are partially schematic top plan and cross-sectional views of a multi-junction SST device with buried contacts configured in accordance with another embodiment of the present technology.
Figure 3B:
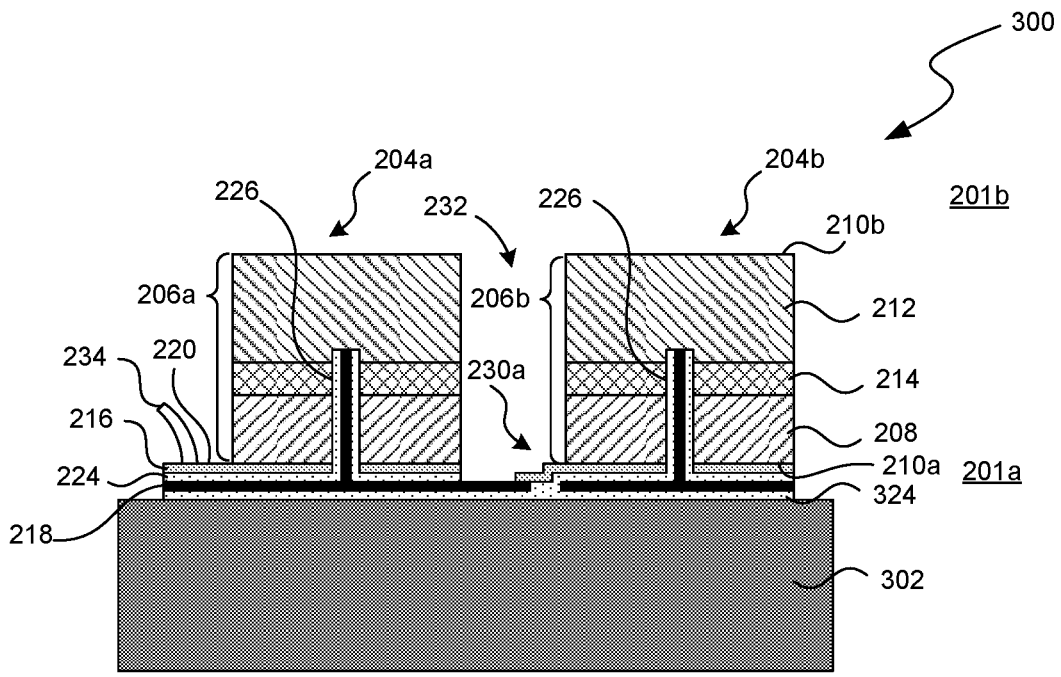
Figure 3C:
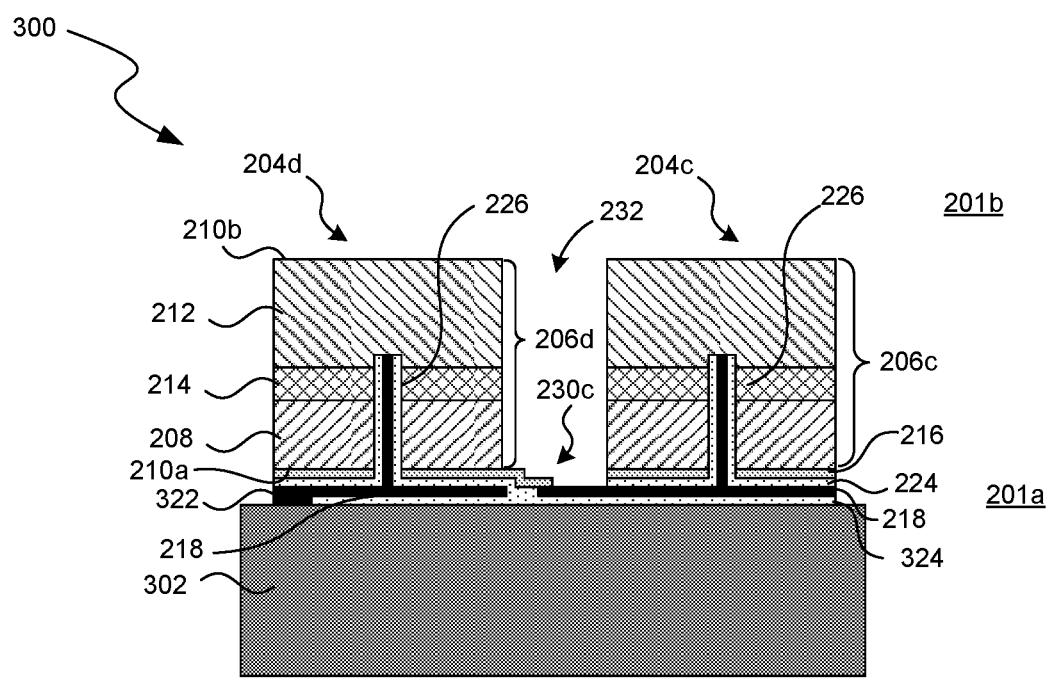

FIG. 3A is a partially schematic top plan view of a multi-junction SST device 300 configured in accordance with another embodiment of the present technology, and FIGS. 3B and 3C are partially schematic cross-sectional views taken substantially along lines 3B-3B and 3C-3C of FIG. 3A, respectively. The SST device 300 can include features generally similar to those of the SST device 200 described above with reference to FIGS. 2A and 2B. For example, as shown in FIGS. 3A-3C, the SST device 300 can include a plurality of SST dies 204 with backside first contacts 216 and buried second contacts 218 coupled together in series at a plurality of interconnect regions 230. In the embodiment illustrated in FIGS. 3A-3C, the SST dies 204 are carried by a conductive, rather than a nonconductive, carrier substrate 302. The conductive carrier substrate 302 can be made from a metal, a metal alloy, a doped silicon, and/or other electrically conductive substrate materials. For example, in various embodiments, the substrate 302 can include copper, aluminum, and/or other suitable metals.

Referring to FIG. 3B, the SST device 300 further includes a second dielectric material 324 positioned between the second contact 218 and the conductive carrier substrate 302 to electrically isolate the two from one another. The second dielectric material 324 can be made from materials similar to those described above with reference to the dielectric material 224 positioned between the first and second contacts 216 and 218. For example, the second dielectric material 324 can be made from silicon oxide ($SiO_2$), silicon nitride ($Si_3N_4$), and/or other suitable generally nonconductive materials.

As shown in FIG. 3C, a portion of the second contact 218 of the fourth SST die 204d can be exposed through the second dielectric material 324 such that it electrically couples to the conductive carrier substrate 302 and thereby forms a backside second terminal 322. Accordingly, the second terminal 322 is electrically accessible from a backside of the SST device 300 (e.g., from the backside of the conductive carrier substrate 302) and facilitates a wirebond-free electrical connection.

Similar to the SST device 200 described above with reference to FIGS. 2A and 2B, the SST device 300 of FIGS. 3A-3C can provide a high forward junction voltage with enhanced current spreading, emission extraction, and overall efficiency. The backside second terminal 322 does not block or interfere with emissions (e.g., light energy) from or to the front side of the SST device 300 (e.g., the second side 210b of the transducer structure 206) and allows the second semiconductor material 212 to span a greater surface area across the fourth SST die 204d (FIG. 3A), thereby further enhancing extraction efficiency. Additionally, the conductive carrier substrate 302 can function as a heat sink to draw heat away from the SST dies 204 during operation. This decreases the operating temperature of the SST device 300 and enhances the overall thermal performance of the device.

Figure 4:
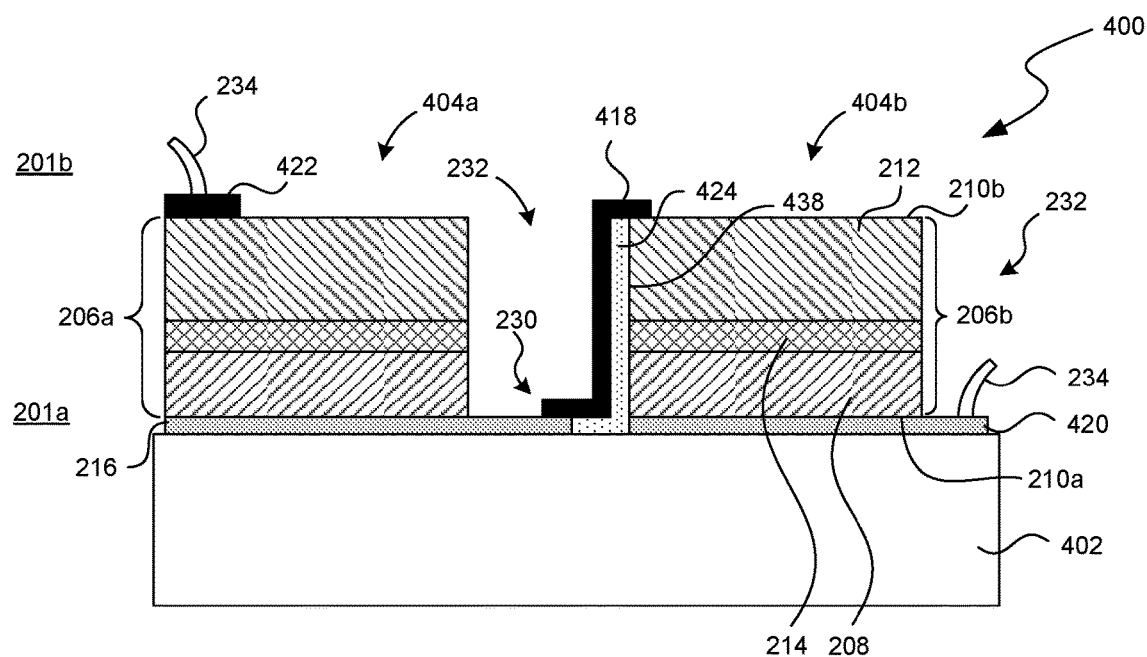
FIG. 4 is a partially schematic, cross-sectional view of a multi-junction SST device with vertical contacts configured in accordance with an embodiment of the present technology.

FIG. 4 is a partially schematic, cross-sectional views of multi-junction SST device 400 ("SST device 400") configured in accordance with a further embodiment of the present technology. The SST device 400 includes features generally similar to the features of the SST devices 200 and 300 described above with reference to FIGS. 2A-3C. For example, the SST device 400 includes SST dies (identified individually as a first SST die 404a and a second SST die 404b, and referred to collectively as SST dies 404) serially coupled together at the interconnect region 230. For illustrative purposes, FIG. 4 shows the SST device 400 having two SST dies 404, but in other embodiments the SST device 400 can include additional SST dies 404 to obtain a desired forward junction voltage.

Rather than buried second contacts 218 (as described above with reference to FIGS. 2B, 3B and 3C), the SST dies 404 shown in FIG. 4 each have a second contact 418 in the second region 201b spaced vertically apart from the first contact 216 in the first region 201a. For example, as shown in FIG. 4, the second contact 418 of the second SST die 404b can extend from the backside first contact 216 of the adjacent first SST die 404a, along a sidewall 438 of the second transducer structure 206b, and onto the second side 210b where it is electrically coupled to the second semiconductor material 212. An underlying dielectric material 424 can extend between the sidewall 438 and the second contact 418 to electrically isolate the second contact 418 from the first contact 216, the first semiconductor material 208 and the active region 214. The dielectric material 424 can be made from materials generally similar to the dielectric materials described above, such as silicon oxide ($SiO_2$), silicon nitride ($Si_3N_4$), and/or other suitable generally nonconductive materials. The vertical SST dies 404, like the SST dies 202 of FIGS. 2A-3C, allow N-type GaN to be positioned at the front side of the SST device 400, and therefore the SST device 400 can have enhanced current spreading and emission extraction compared to conventional high-voltage SST devices with lateral SST dies. Also similar to the SST devices 200 and 300 described above, the SST device 400 of FIG. 4 can enhance efficiency of the system due to the high combined forward junction voltage of the SST dies 404.

As further shown in FIG. 4, in various embodiments, the vertical SST dies 404 can be positioned on a generally nonconductive carrier substrate 402. The carrier substrate 402 can be made from materials similar to those of the generally nonconductive substrate 202 described above with reference to FIGS. 2A and 2B, such as ceramic, silicon, polysilicon, and/or other generally nonconductive substrate materials. Accordingly, the SST device 400 includes first and second terminals 420 and 422 that are electrically accessible from a front side of the SST device 400 on a surface facing away from the carrier substrate 402. For example, in the embodiment illustrated in FIG. 4, the first terminal 420 is exposed through one of the openings 232 and positioned in the first region 201a, and the second terminal 422 is positioned on the second side 210b of the first transducer structure 206a in the second region 201b. Wirebonds 234 and/or other suitable electrical connectors can be used to couple the first and second terminals 420 and 422 to a power supply (not shown).

Figure 5:
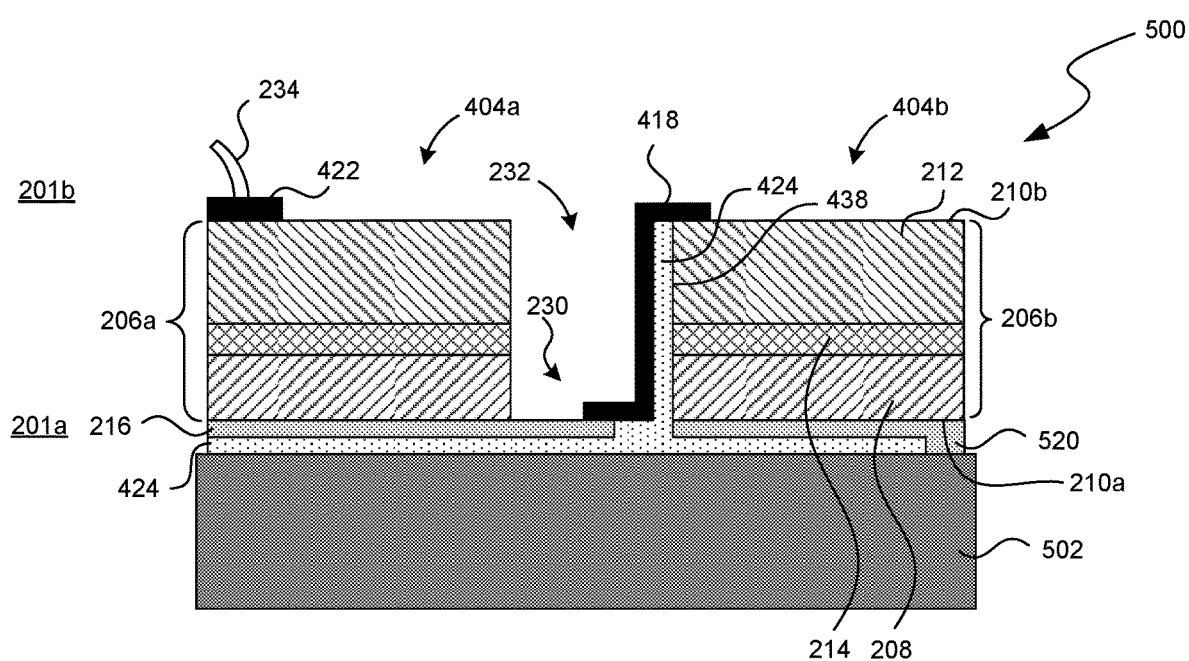
FIG. 5 is a partially schematic, cross-sectional view of a multi-junction SST device with vertical contacts configured in accordance with another embodiment of the present technology.

FIG. 5 is a partially schematic, cross-sectional view of a multi-junction SST device 500 ("SST device 500") configured in accordance with another embodiment of the present technology. The SST device 500 includes features generally similar to the features of the SST device 400 described above with reference to FIG. 4. For example, the SST device 500 includes vertical SST dies 404 serially coupled together at the interconnect region 230. However, the SST device 500 shown in FIG. 5 includes a conductive carrier substrate 502 made from metals, metal alloys, doped semiconductor materials, and/or other suitable conductive substrate materials. The SST device 500 can therefore include a first terminal 520 electrically coupled to the conductive carrier substrate 502 and electrically accessible from the backside of the SST device 500 to facilitate wirebond-free connections. A second terminal 522 can be positioned in the second region 201b and can be electrically accessible from the front side of the SST device 500. The conductive carrier substrate 502 can draw heat from the SST dies 404 during operation and thereby enhance the thermal performance of the SST device 500.

Figure 6A:
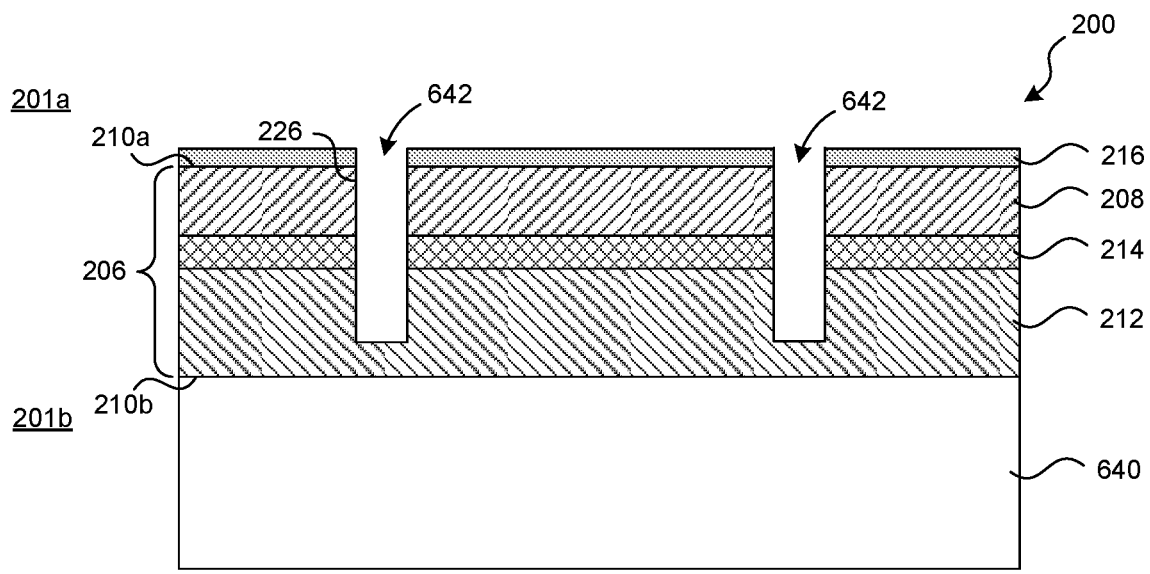
FIGS. 6A-6C are partially schematic, cross-sectional views illustrating a process of forming the multi-junction SST device of FIGS. 2A and 2B in accordance with an embodiment of the present technology.
Figure 6B:
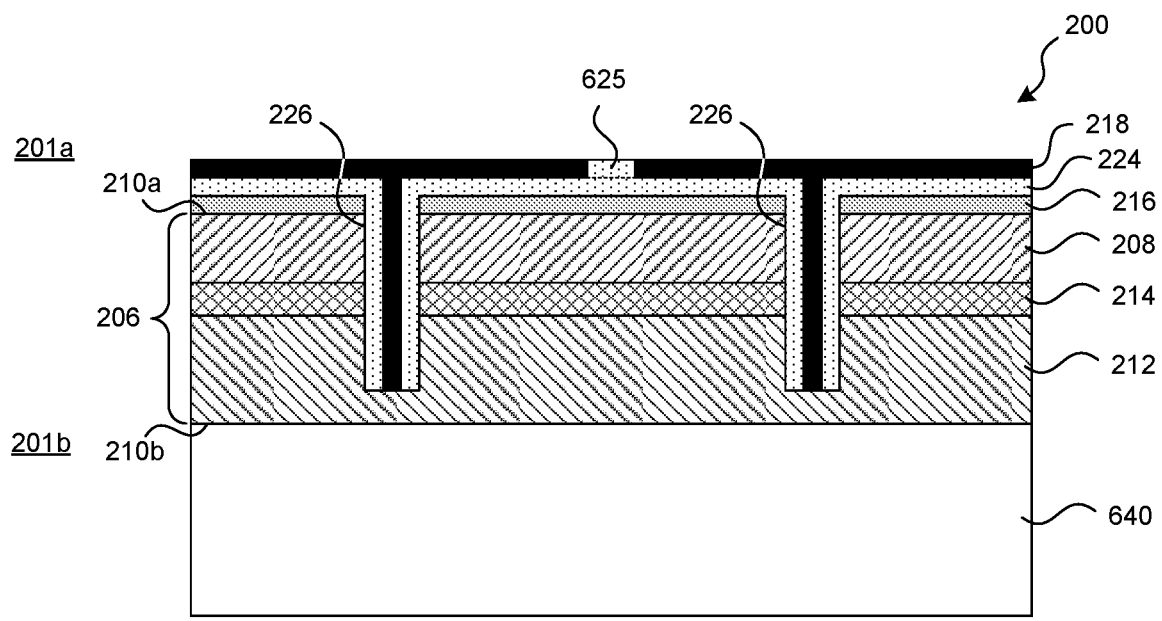
Figure 6C:
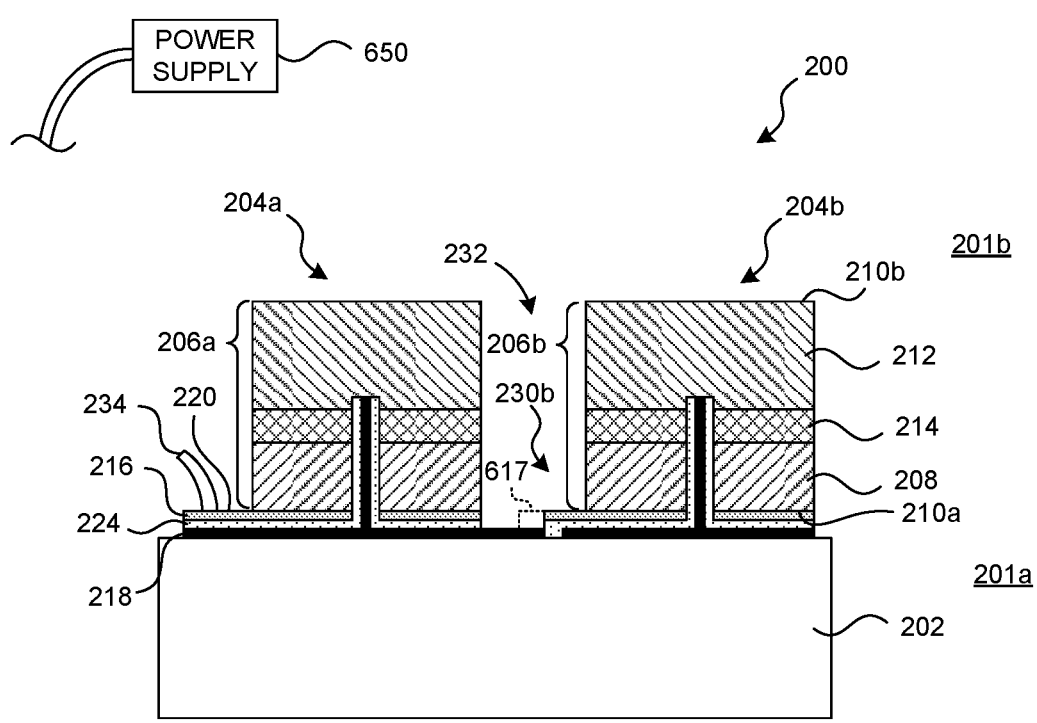

FIGS. 6A-6C are partially schematic, cross-sectional views illustrating a process for forming the SST device 200 of FIGS. 2A and 2B in accordance with an embodiment of the present technology. FIG. 6A, for example, illustrates the SST device 200 at a stage of the process after the transducer structure 206 has been formed on a growth substrate 640. The transducer structure 206 can be formed via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the transducer structure 206 may be formed using other suitable epitaxial growth techniques.

As further shown in FIG. 6A, the first contact 216 can be formed in the first region 201a (e.g., on the first side 210a of the transducer structure 206) and a plurality of vias 642 can be formed through the first contact 216. The first contact 216 can be formed using chemical vapor deposition ("CVD"), physical vapor deposition ("PVD"), atomic layer deposition ("ALD"), spin coating, patterning, and/or other suitable techniques known in the semiconductor fabrication arts. The vias 642 can be formed by positioning a mask (not shown) over the first contact 216 and etching (e.g., by wet etch, dry etch, and/or other suitable process) through the exposed portions of the first contact 216 and the transducer structure 206. In other embodiments, the vias 642 can be formed using other suitable removal methods. In further embodiments, the vias 642 can be formed before the formation of the first contact 216 such that the first contact 216 is subsequently deposited, etched, and/or otherwise formed in the first region 201a without obstructing the vias 632. Each via 642 can extend to or into the second semiconductor material 212 to define the dimensions of the subsequently formed buried second contact 218 (FIG. 6B).

FIG. 6B shows a later stage in the process after the buried second contacts 218 have been formed at the backside of the SST device 200. The dielectric material 224 can first be disposed over the first contact 216 and along the sidewalls 226 of the vias 642. A portion of the second semiconductor material 212 in the via 642 is not covered by the dielectric material 224 to provide access for subsequent electrical connections. For example, in various embodiments, the dielectric material 224 can be formed along the sidewalls 226 of the vias 642 using spacer etching. In other embodiments, the dielectric material 224 can be formed using CVD, PVD, ALD, patterning, selective etching, and/or other suitable formation processes.

As further shown in FIG. 6B, an isolating protrusion 625 made from the dielectric material 224 and/or other generally nonconductive material can be formed between portions of the second contact 218. The isolating protrusions can define the lateral bounds of individual SST dies 204 (FIG. 6C) and electrically isolate individual second contacts 218 from one another. In various embodiments, the isolating protrusion 625 can be formed by selectively etching a notch into the second contact 218 and selectively depositing the isolating protrusion 625 therein. In other embodiments, isolating protrusions 625 can be formed using other suitable methods known in the semiconductor fabrication arts. In further embodiments, individual second contacts 218 can be electrically isolated from one another during subsequent processing stages.

FIG. 6C illustrates a further stage in the process after the growth substrate 640 has been removed, the SST device 200 has been inverted, and the carrier substrate 202 has been positioned in the first region 201a on the second contacts 218. The growth substrate 640 can be removed from the second side 210b of the transducer structure 206 by backgrinding, etching (e.g., wet etching, dry etching, etc.), and/or otherwise removing the growth substrate 640 from the second semiconductor material 212. The carrier substrate 202 can be attached to the backside of the SST dies 204 using temporary and/or permanent bonding materials (e.g., WaferBOND™ HT-10.10 from Brewer Science, Inc. of Rolla, Mo.). In other embodiments, the carrier substrate 202 can be formed or attached to the SST dies 204 using other suitable methods known in the semiconductor fabrication arts.

As shown in FIG. 6C, portions of the transducer structure 206 have been removed to form the opening 232 and to separate the transducer structure 206 into separate transducer structures 206a and 206b with isolated p-n junctions. The opening 232 can also expose portions of the second contact 218 of the first SST die 204a and the first contact 216 of the adjacent second SST die 204b such that the first and second SST dies 204a and 204b are electrically isolated from one another. The transducer structure 206, the first contact 216, and the dielectric material 224 can be removed by positioning a mask over the front side of the SST device 200 and selectively etching away the various materials. In other embodiments, the transducer structure 206, the first contact 216, the second contact 218, the dielectric material 224, and/or other portions of the SST device 200 can be removed using other methods known in the semiconductor fabrication arts.

After electrically isolating the SST dies 204, an electrically conductive material 617 (shown in broken lines), such as the material used for the first and/or second contacts 216 and 218, can be deposited at the interconnect region 230 to serially couple the first contact 216 and the second contact 218 of adjacent SST dies 204. A portion of the first contact 216 of the first SST die 204a can be exposed to define the first terminal 220, and a portion of the second contact 218 of the last SST die 204 in the series (e.g., the fourth SST die 204d shown in FIG. 2A) can be exposed to define the second terminal 222, or vice versa. The first and second terminals 220 and 222 can then be electrically coupled to a power supply 650 via wirebonds 234 and/or other electrical connectors to drive the SST device 200. In various embodiments, the process can further include roughening the second semiconductor material 212 (e.g., N-type GaN) to enhance light extraction from the SST device 200.

The SST device 300 of FIGS. 3A-3C can be formed using methods generally similar to the methods discussed above with reference to FIGS. 6A-6C. However, forming the SST device 300 can further include forming the second dielectric material 324 on the second contact 218 before the conductive carrier substrate 302 is positioned thereon. Additionally, at least a portion of one of the second contacts 218 can be exposed through the second dielectric material 324 and coupled to the conductive carrier substrate 302 to form the backside second terminal 322.

Figure 7A:
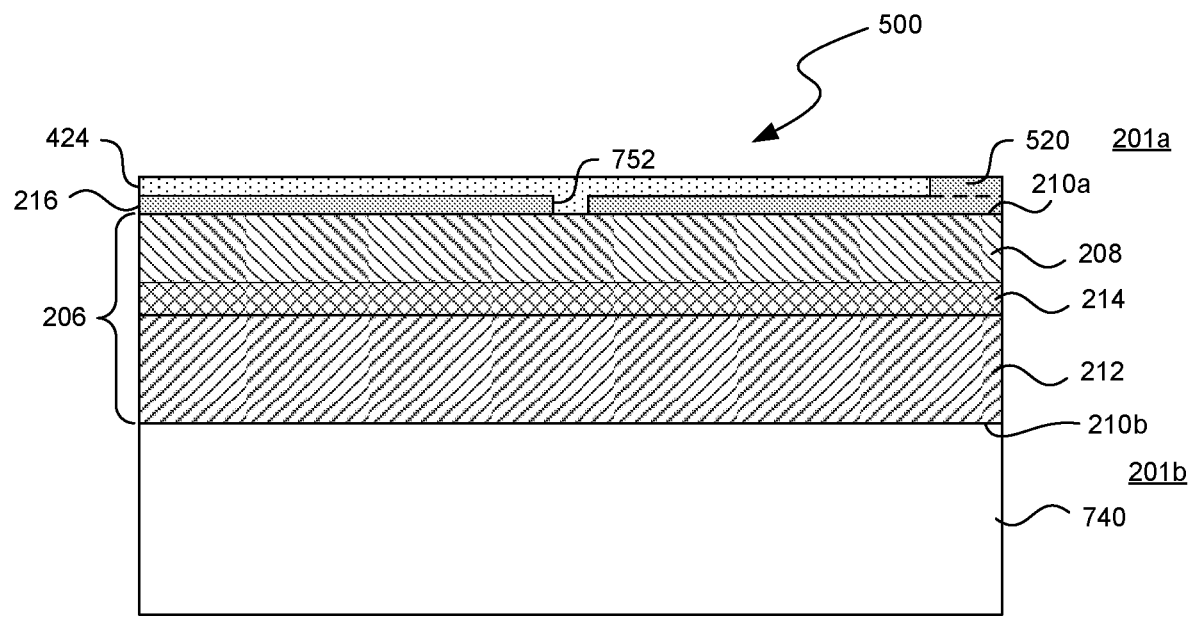
FIGS. 7A and 7B are partially schematic, cross-sectional views illustrating a process of forming the multi-junction SST device of FIG. 5 in accordance with an embodiment of the present technology.
Figure 7B:
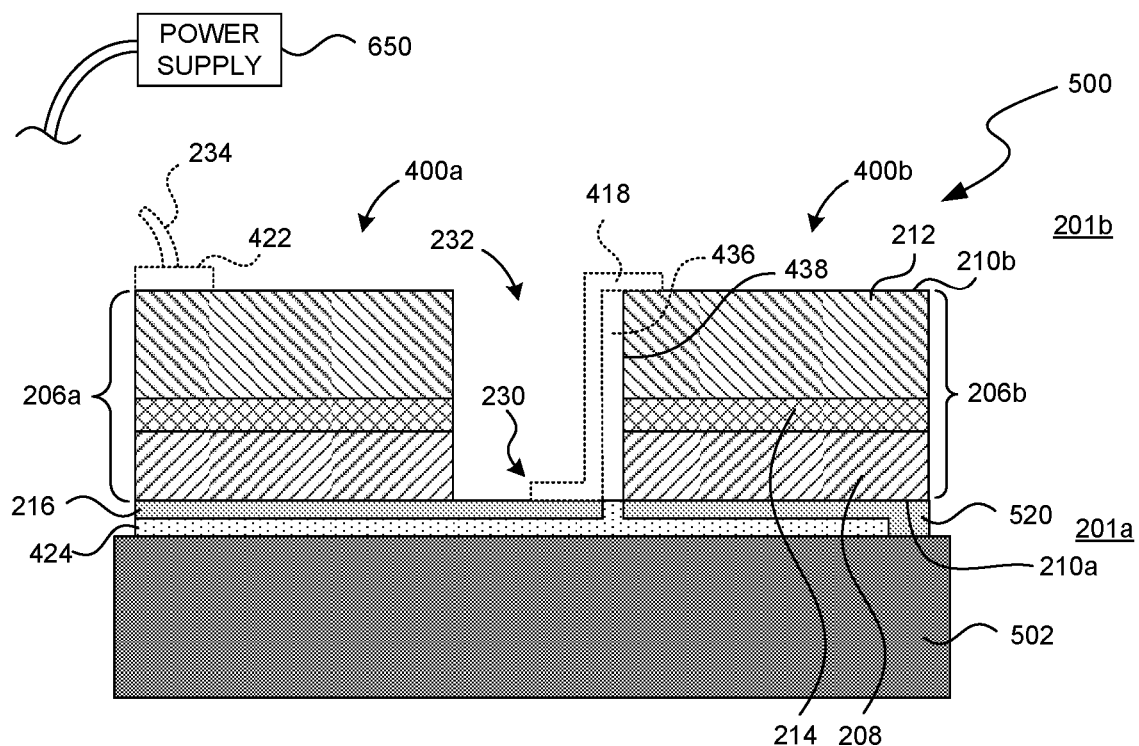

FIGS. 7A and 7B are partially schematic, cross-sectional views illustrating a process for forming the SST device 500 of FIG. 5 in accordance with an embodiment of the present technology. FIG. 7A, for example, illustrates the SST device 500 at a stage of the process after the transducer structure 206 has been formed on a growth substrate 740 using MOCVD, MBE, LPE, HVPE, and/or other suitable epitaxial growth techniques. The first contact 216 and the dielectric material 424 can then be formed sequentially in the first region 201a (e.g., on the first side 210a of the transducer structure 206) using CVD, PVD, ALD, patterning, and/or other suitable formation techniques. As shown in FIG. 7A, the dielectric material 424 can extend into a notch 752 between portions of the first contact 216 to demarcate the lateral bounds of the subsequently formed individual SST dies 404 (FIG. 7B). The notch 752 can be formed by selectively etching and/or otherwise removing portions of the first contact 216, or the first contact 216 can be selectively formed to include the notch 752. As further shown in FIG. 7A, a portion of the first contact 216 can remain exposed through the dielectric material 424 (e.g., using selective etching or deposition), and additional conductive material can be formed thereon to define the backside first terminal 520.

FIG. 7B shows a further stage in the process after the growth substrate 740 has been removed from the second side 210b of the transducer structure 206, the SST device 500 has been inverted, and the conductive carrier substrate 502 has been positioned on the backside of the SST device 500. When the carrier substrate 502 is attached, the exposed backside first terminal 520 can electrically coupled thereto to provide electrical access to the backside of the SST device 500. Portions of the transducer structure 206 can then be removed between the SST dies 404 to form a plurality of separate transducer structures 206 with isolated p-n junctions that can be subsequently coupled together in series. These steps can be performed using generally similar methods as those described above with reference to FIG. 6C.

Once the individual SST dies 404 have been formed, a dielectric material 436 and the second contact 418 (both shown in broken lines) can then be sequentially formed along the sidewall 438 of the transducer structure 206 to connect the SST dies 404 in series. The dielectric material 436 and the second contact 418 can be formed using CVD, PVD, ALD, and/or other suitable formation techniques. The second terminal 522 can be formed independently of or in conjunction with the second contact(s) 418 on the second side 210b of the one of the transducer structure 206 using CVD, PVD, ALD, and/or other suitable formation techniques. The first and second terminals 520 and 522 can then be connected to a power supply 750 that can drive the multi-junction SST device 500.

Figure 8:
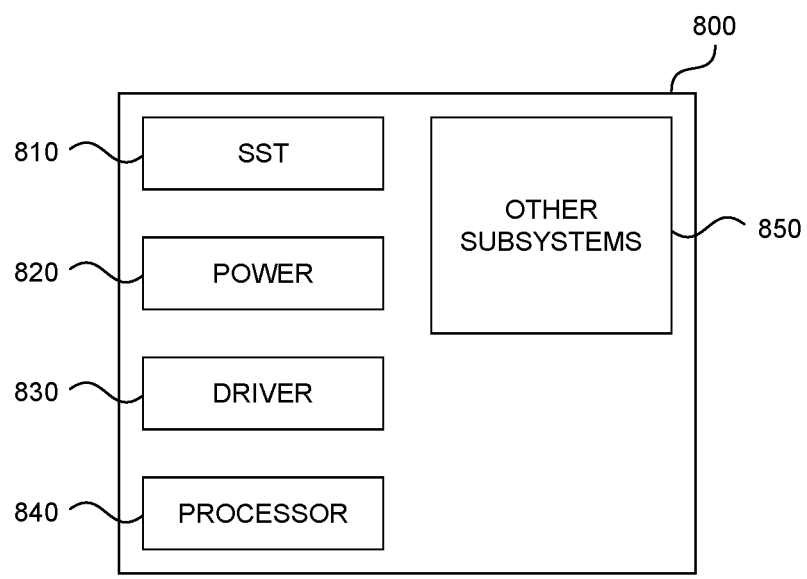
FIG. 8 is a schematic view of a system that incorporates an SST device in accordance with embodiments of the present technology.

Any of the high-voltage SST devices described above with reference to FIGS. 2A-7B can be incorporated into any of a myriad of larger and/or more complex systems, a representative example of which is system 800 shown schematically in FIG. 8. The system 800 can include an SST device 810, a power supply 820, a driver 830, a processor 840, and/or other subsystems or components 850. As discussed above, the SST device 810 can decrease the difference between the input and the output voltage of the power supply 820 and/or the driver 830, and thereby increase the efficiency of the system 800. In various embodiments, the SST device 810 can have a sufficiently high voltage such that the driver 830 can be eliminated from the system 800. The resulting system 800 can perform any of a wide variety of functions, such as backlighting, general illumination, power generation, sensors, and/or other functions. Accordingly, representative systems 800 can include, without limitation, hand-held devices (e.g., cellular or mobile phones, tablets, digital readers, and digital audio players), lasers, photovoltaic cells, remote controls, computers, and appliances (e.g., refrigerators). Components of the system 800 may be housed in a single unit or distributed over multiple, interconnected units (e.g., through a communications network). The components of the system 800 can also include local and/or remote memory storage devices, and any of a wide variety of computer-readable media.

From the foregoing, it will be appreciated that specific embodiments of the technology have been described herein for purposes of illustration, but that various modifications may be made without deviating from the disclosure. For example, the SST devices 200 and 300 shown in FIGS. 2A-3C include 2×2 arrays of SST dies 204. However, in other embodiments, SST devices 200 and 300 can include two, three, or more than four SST dies 204 arranged in arrays having a variety of configurations, such as linear arrays, circular arrays, etc. Certain aspects of the new technology described in the context of particular embodiments may be combined or eliminated in other embodiments. For example, the SST dies 204 with buried contacts 218 shown in FIGS. 2A-3C can be serially coupled with the vertical SST dies 404 of FIGS. 4 and 5. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A multi-junction solid state transducer (SST) device, comprising:
   a first terminal;
   a second terminal; and
   a plurality of transducer structures electrically connected in series between the first and second terminals, each transducer structure including:
      a first semiconductor material,
      a second semiconductor material,
      an active region between the first and second semiconductor materials,
      a first contact structure electrically coupled to the first semiconductor material at a first surface opposite the active region, and
      a second contact structure electrically coupled to the second semiconductor material at a second surface opposite the active region,
   wherein each of the plurality of transducer structures is separated from an adjacent transducer structure of the plurality by a corresponding channel extending from the first surface to the second surface and exposing the corresponding first contact structure,
   wherein the second contact structure of a first transducer structure of the plurality extends over a dielectric sidewall lining layer laterally separating the second contact structure from the first semiconductor material and from the first contact structure of the first transducer structure and into the channel of an adjacent second transducer structure of the plurality where it is electrically connected to the exposed first contact structure of the adjacent second transducer structure by a coupling in the channel.

2. The multi-junction SST device of claim 1, wherein the first semiconductor material of each of the plurality of transducer structures comprises P-type gallium nitride (P-type GaN), the second semiconductor material of each of the plurality of transducer structures comprises N-type gallium nitride (N-type GaN), and the active region of each of the plurality of transducer structures comprises indium gallium nitride (InGaN).

3. The multi-junction SST device of claim 1, wherein the first contact structure of each of the plurality of transducer structures comprises nickel (Ni), silver (Ag), copper (Cu), aluminum (Al), tungsten (W), or a combination thereof.

4. The multi-junction SST device of claim 1, wherein the second contact structure of each of the plurality of transducer structures comprises titanium (Ti), aluminum (Al), nickel (Ni), silver (Ag), or a combination thereof.

5. The multi-junction SST device of claim 1, wherein the dielectric sidewall lining layer comprises silicon oxide ($SiO_2$) or silicon nitride ($Si_3N_4$).

6. The multi-junction SST device of claim 1, wherein the first terminal comprises a wirebond directly coupled to an exposed region of the first contact structure of one of the plurality of transducer structures.

7. The multi-junction SST device of claim 1, wherein the second terminal comprises a wirebond directly coupled to a second contact structure of one of the plurality of transducer structures.

8. The multi-junction SST device of claim 1, wherein the plurality of transducer structures is configured to emit electromagnetic radiation in at least one of the ultraviolet spectrum, the visible spectrum, and the infrared spectrum.

9. The multi-junction SST device of claim 1, wherein the first contact structure of each of the plurality of transducer structures comprises a reflective material.

10. The multi-junction SST device of claim 1, further comprising a power supply electrically coupled to the first and second terminals, wherein the power supply has an output voltage and the plurality of transducer structures have a combined forward junction voltage approximately the same as the output voltage.

11. The multi-junction SST device of claim 1, further comprising a nonconductive carrier substrate in contact with the first contact structures of the plurality of transducer structures.

12. The multi-junction SST device of claim 1, further comprising a conductive carrier substrate attached to the first contact structures of the plurality of transducer structures by a layer of dielectric material.

13. A multi-junction solid state transducer (SST) device, comprising:
- a first terminal;
- a second terminal; and
- a plurality of transducer structures electrically connected in series between the first and second terminals, each transducer structure including a first contact structure electrically coupled to a first semiconductor material on a first surface opposite an active region of the transducer structure and a second contact structure electrically coupled to a second semiconductor material on a second surface opposite the active region of the transducer structure,
- wherein a first transducer structure of the plurality of transducer structures is separated from an adjacent second transducer structure of the plurality of transducer structures by a channel extending from the first surface to the second surface and exposing the first contact structure of the first transducer structure,
- wherein the second contact structure of the adjacent second transducer extends over a dielectric sidewall lining layer laterally separating the second contact structure of the adjacent second transducer from the first semiconductor material and from the first contact structure of the adjacent second transducer structure and into the channel where it is electrically connected to the exposed first contact structure of the first transducer structure by a coupling in the channel.

14. The multi-junction SST device of claim 13, wherein the first contact structure of each of the plurality of transducer structures comprises nickel (Ni), silver (Ag), copper (Cu), aluminum (Al), tungsten (W), or a combination thereof.

15. The multi-junction SST device of claim 13, wherein the second contact structure of each of the plurality of transducer structures comprises titanium (Ti), aluminum (Al), nickel (Ni), silver (Ag), or a combination thereof.

16. The multi-junction SST device of claim 13, wherein the dielectric sidewall lining layer comprises silicon oxide ($SiO_2$) or silicon nitride ($Si_3N_4$).

17. The multi-junction SST device of claim 13, wherein the plurality of transducer structures is configured to emit electromagnetic radiation in at least one of the ultraviolet spectrum, the visible spectrum, and the infrared spectrum.

18. The multi-junction SST device of claim 13, wherein the first contact structure of each of the plurality of transducer structures comprises a reflective material.

19. The multi-junction SST device of claim 13, wherein the first terminal comprises a wirebond directly coupled to an exposed region of the first contact structure of the second transducer structure of the plurality of transducer structures.

20. The multi-junction SST device of claim 13, wherein the second terminal comprises a wirebond directly coupled to a second contact structure of the first transducer structure of the plurality of transducer structures.

* * * * *